United States Patent [19]

Storimans

[11] Patent Number: 4,624,289

[45] Date of Patent: Nov. 25, 1986

[54] BELT TRANSPORTER FOR ELECTRONIC COMPONENTS

[75] Inventor: Franciscus J. A. Storimans, Stouffville, Canada

[73] Assignee: Frank Storimans Limited, Gormley, Canada

[21] Appl. No.: 790,654

[22] Filed: Oct. 24, 1985

Related U.S. Application Data

[63] Continuation of Ser. No. 734,828, May 17, 1985, abandoned, which is a continuation of Ser. No. 555,824, Nov. 28, 1983, abandoned.

[51] Int. Cl.$^4$ .............................................. B21F 45/00
[52] U.S. Cl. ...................................... 140/105; 72/422
[58] Field of Search ................. 140/105; 29/753, 745; 226/170, 171; 72/421, 422, 423, 380, 386; 83/422, 423, 623

[56] References Cited

U.S. PATENT DOCUMENTS

| | | | |
|---|---|---|---|
| 3,331,544 | 7/1967 | Bachman, Jr. et al. | 226/71 |
| 3,553,814 | 1/1971 | Rider | 29/753 |
| 3,780,921 | 12/1973 | Harp | 83/423 |
| 3,960,306 | 6/1976 | Hamaguchi | 226/170 |
| 4,039,108 | 8/1977 | Hahn et al. | 226/171 |
| 4,344,219 | 8/1982 | Tanabe et al. | 140/105 |
| 4,428,519 | 1/1984 | Reichl et al. | 226/170 |

Primary Examiner—Lowell A. Larson
Attorney, Agent, or Firm—Fetherstonhaugh & Co.

[57] ABSTRACT

A machine for forming the leads of electronic components has an endless load transporting belt. The load transporting belt is mounted on rollers which are arranged in a triangular configuration so as to support the load transporting belt with its forward run extending along a longitudinally elongated planner work plane which extends through a work station. A first guide rail is disposed opposite and extends longitudinally of the forward run to define a component guideway therebetween which extends through said work station. A second guide rail is located below and supports the forward of the load transporting belt. A drive motor is connected to the load transporting belt to drive it through said work station. At least one lead working mechanism located in said work station and has work tools disposed laterally outwardly from the guide rails and remote from said support face, for use in forming the leads of said electronic components.

5 Claims, 5 Drawing Figures

BELT TRANSPORTER FOR ELECTRONIC COMPONENTS

This application is a continuation of application Ser. No. 734,828, filed May 17, 1985, now abandoned which is a continuation of application Ser. No. 555,824, filed Nov. 28, 1983 now abandoned.

FIELD OF INVENTION

This invention relates to machines for forming electronic components.

PRIOR ART

In known machines for forming electronic components, the components, which are initially supported by a tape, are severed from the tape and transferred to a transporting conveyor which extends through a working station. Generally, the transporting conveyor is in the form of a transporter wheel which drives the components continuously through a working station. The components are formed by being driven against plow blades or driven between bending wheels or knives. These known mechanisms have not permitted the use of conventional punch press type machine tools and have therefore been difficult to service and maintain. Furthermore, considerable difficulty has been experienced in attempting to accurately position the components with respect to the forming tools to ensure consistent forming of the leads.

Transistors and the like are frequently mounted on endless tapes with the main body portion disposed laterally from an edge of the tape and the leads secured to an edge of the tape. In this configuration, the leads extend parallel to one another in the plane of the tape. In most instances, it is necessary to laterally offset at least one of the leads in the working station. Considerable difficulty has been experienced in effecting this lateral offset after the components have been severed from the tape.

The machine of the present invention provides a simple and efficient component transporting mechanism for transporting the components through a working station in a manner in which they are securely retained until engaged by the working tool.

It is an object of the present invention to provide a simple and efficient machine for forming the leads of electronic components which can be readily serviced.

It is a further object of the present invention to provide support for electronic components in a longitudinally elongated planner work plane which extends through a work station which is large enough to accommodate more than one work mechanism.

SUMMARY OF INVENTION

According to one aspect of the present invention a machine for forming the leads of electronic components, the electronic components being initially arranged with their leads secured to and projecting laterally from an elongated tape at uniformly spaced intervals along the length thereof, said machine comprising; a frame having a support face extending in a first plane, an endless load transporting belt, belt mounting means on said frame and projecting from said first plane for supporting said load transporting belt with its forward run extending along a longitudinally elongated planner work plane which extends through a work station, a first guide rail disposed opposite and extending longitudinally of said forward run to define a component guideway therebetween which extends through said work station, a second guide rail underlying and supporting said forward of said load transporting belt, and drive means engaging said load transporting belt to drive it through said work station, at least one lead working mechanism located in said work station, said lead working mechanism having work tool members disposed laterally outwardly from said guide rails and remote from said support face, for use in forming the leads of said electronic components.

PREFERRED EMBODIMENT

The invention will be more clearly understood after reference to the following detailed specification read in conjunction with the drawings wherein.

Figure 1:
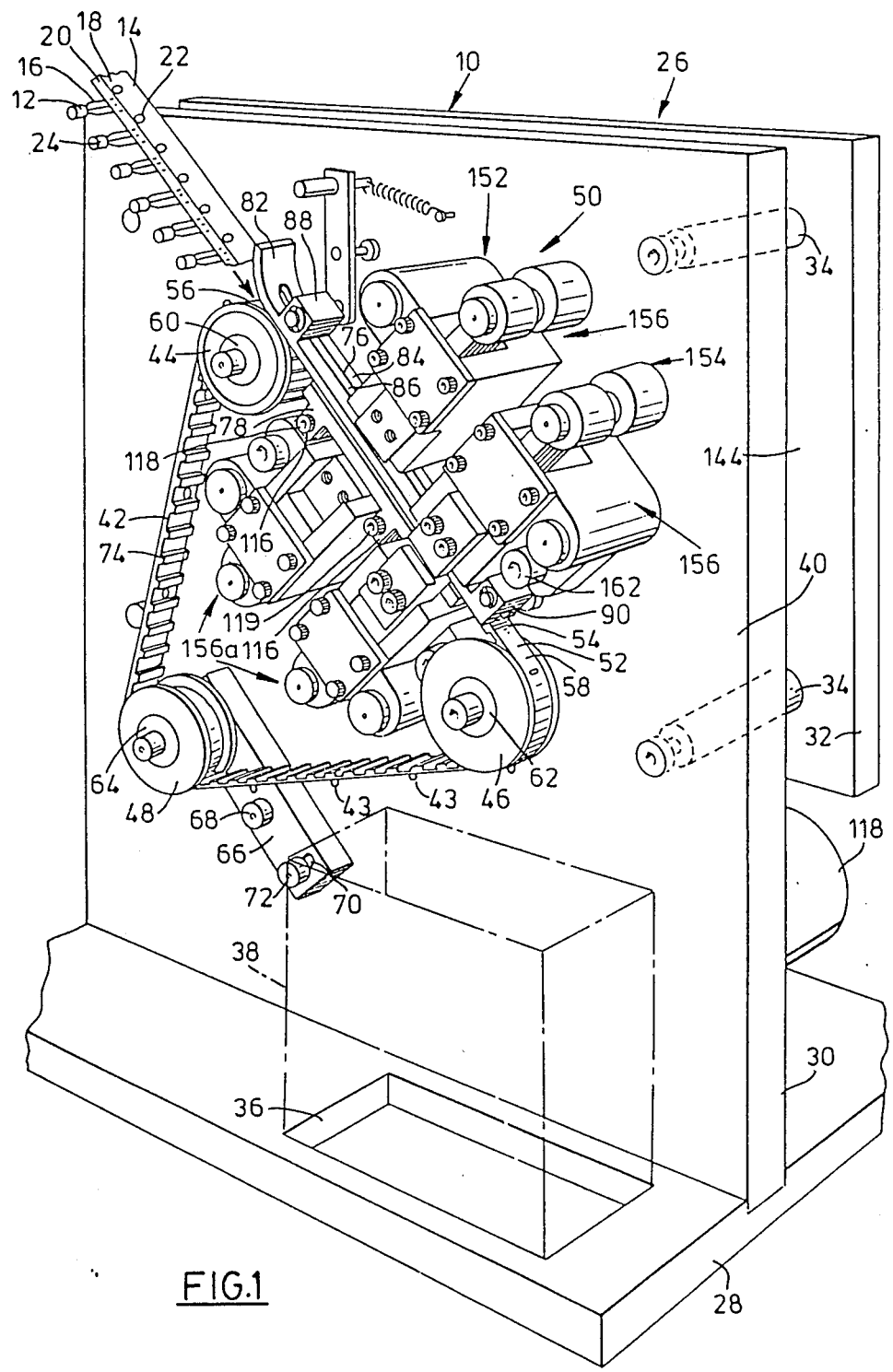
FIG. 1 is a pictorial view of a machine for forming electronic components constructed in accordance with an embodiment of the present invention.

With reference to FIG. 1 of the drawings, the reference numeral 10 refers generally to a machine for forming the leads of electronic components constructed in accordance with an embodiment of the present invention.

The electronic components such as transistors 12 are mounted on a tape 14 with the leads 16 trapped between two overlapping layers 18 and 20 of the tape 14. Perforations 22 are formed at uniformly spaced intervals along the length of the tape 14. The main body portions 24 of the transistors 12 are arranged at uniformly spaced intervals along the tape 14 and spaced laterally outwardly from the side edge of the tape 14.

The machine 10 comprises a frame which is generally identified by the reference numeral 26. The frame 26 consists of a base plate 28, an upright front wall 30, a back wall 32 and spacers 34 which serve to support the back wall 32 in a spaced parallel relationship with respect to the front wall 30.

A rectangular shaped aperture 36 is formed in the base plate 28 and serves to support a receptacle 38 in a position to receive formed components.

The front wall 30 has a support face 40 which extends in a vertically oriented first plane. A work station 50 is located on the support face 40. An endless load transporting belt 42 is supported by pulleys 44, 46 and 48 with a forward run portion 52 thereof extending along a longitudinally elongated planner work plane 54 which extends between pullies 44 and 46. The plane 54 is downwardly and rearwardly inclined from the input end 56 thereof to the output end 58. The pulleys 44 and 48 are mounted for rotation on shafts 60, 62 and 64. The shaft 60 is mounted in the front wall 30 and back wall 32 and projects forwardly from the support face 40. The shaft 62 is mounted in the front wall 30 and projects forwardly from the support face 40. The shaft 64 is mounted on a lever arm 66. The lever arm 66 is pivoted on a pivot pin 68 which projects from the support face 40. An arcuate shaped passage 70 is formed in the lever arm 66 and a mounting screw 72 extends through the passage 70 and is threadedly mounted in a passage formed in the front wall 30. The lever arm 66 can be pivoted about the pivot pin 68 when the mounting screw 72 is released to adjust the tension in the load transporting belt 42 and to facilitate the removal of the load transporting belt 42 as required in use. The pulley 44 is a toothed pulley which is keyed to the shaft 60. The teeth which are formed on the pulley 44 are proportioned to mesh with the teeth 74 formed on the inner face of the load transporting belt 42.

Figure 2:
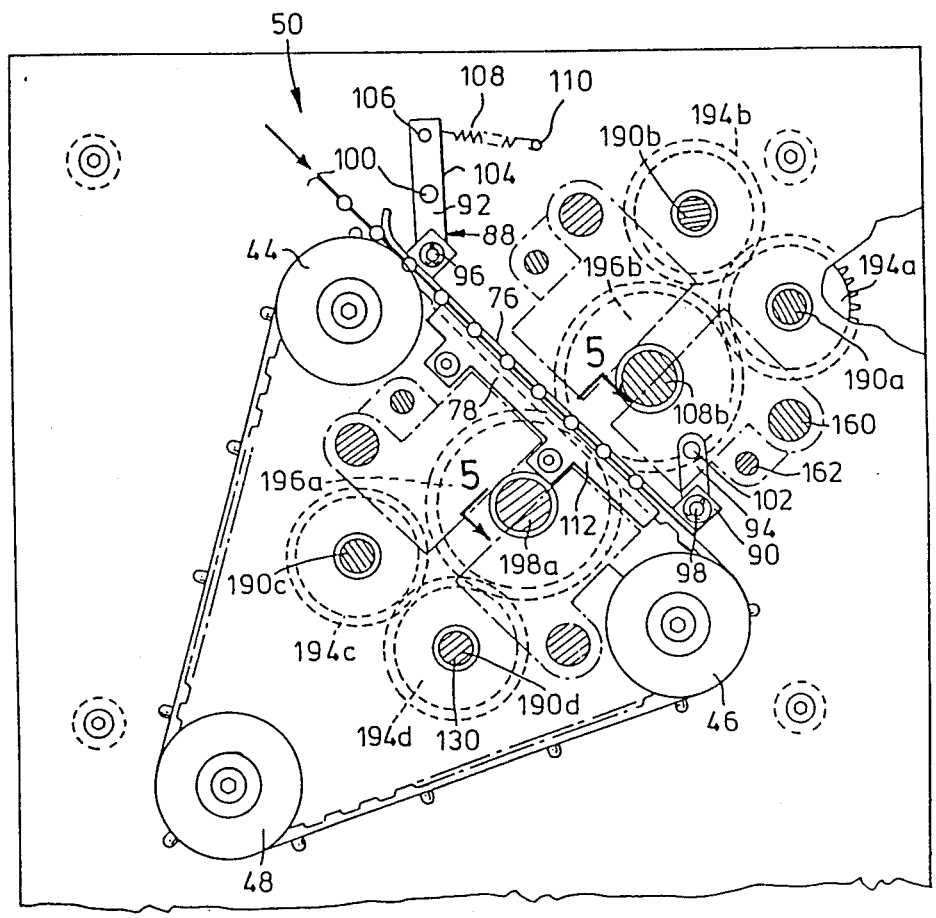
FIG. 2 is a side view of the upper portion of the front face of the machine of FIG. 1.
Figure 5:
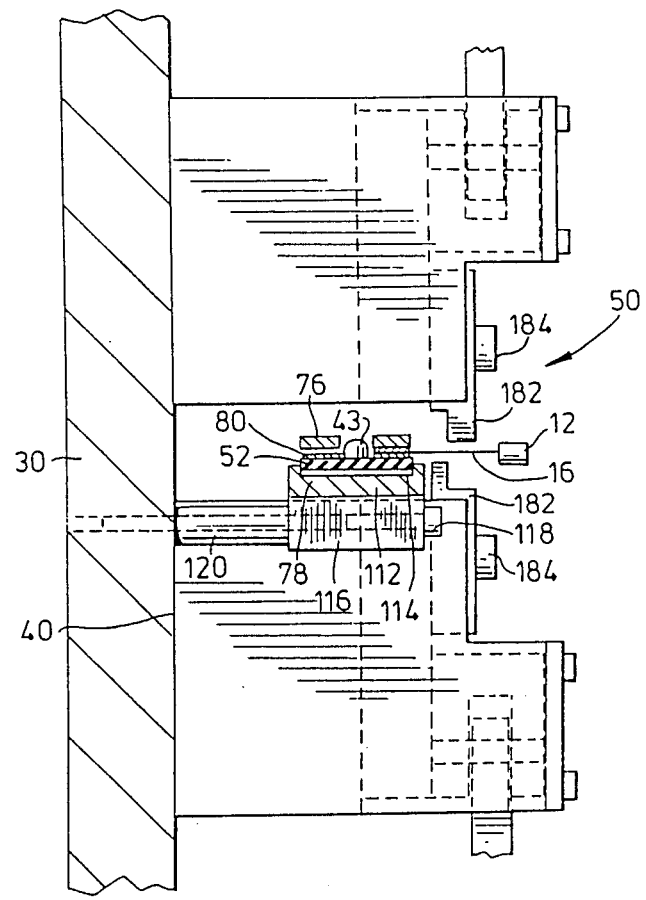
FIG. 5 is a sectional view taken along the 5—5 of FIG. 2.

As shown in FIGS. 1, 2 and 5 of the drawings, a first guide rail 76 and a second guide rail 78 are mounted one on either side of the forward run portion 52 of the load transporting belt 42 and extend longitudinally through the work station 50. The first guide rail 76 and second guide rail 78 are disposed in a face-to-face relationship with respect to one another and define a narrow passage 80 therebetween.

The first guide rail 76 has a front end portion 82 which is outwardly curved to facilitate the entry of the tape 14 into the input end 56. The first guide rail 76 also includes a longitudinally elongated main body portion 84 along the length of which a narrow slot 86 extends. Posts 88 and 90 project upwardly from the main body portion 84 adjacent opposite ends thereof. The post 88 is pivotally connected to a lever arm 92 and the post 90 is pivotally connected to a lever arm 94 by means of pivot pins 96 and 98 respectively. The lever arms 92 and 94 are pivotally mounted on the front wall 30 by means of pivot pins 100 and 102 respectively. The lever arm 92 has an extension 104 which projects from the pivot pin 100. The extension 104 has a pin 106 mounted adjacent its outer end. The inner end of the pin 106 is connected by means of a spring 108 to a pin 110 which is mounted on the front wall 30.

In use, the lever arms 92 and 94 function as a parallogram linkage which serves to maintain the first guide rail 76 parallel to the second guide rail 78 and all positions of the first guide rail 76. Movement of the first guide rail 76 away from the second guide rail 78 can be effected by manually engaging the pin 106 and rotating the lever arm 92 in a counterclockwise direction about the pivot pin 100. By releasing the pin 106, the spring 108 will serve to rotate the lever arm 104 in a clockwise direction thereby moving the first guide rail 76 toward the second guide rail 78.

The second guide rail 78 comprises a longitudinally elongated main body portion 112. A shallow U-shaped channel 114 is formed in the upper face of the second guide rail 112 and extends longitudinally thereof. The channel 114 has a width which is adapted to receive the forward run 52 of the load transporting belt 42 in a close fitting sliding relationship. Support posts 116 depend from the main body portion 112 and mounting pins 119 serve to secure the posts 116 with respect to the front wall 30. Spacers 120 serve to space the guide rail 76 laterally outwardly from the support face 40 of the front wall 30.

The load transporting belt 42 is formed with a plurality of pins 43 projecting upwardly from the outer face thereof and uniformly spaced intervals along the length thereof. The pins 43 are proportioned and aligned to pass longitudinally through the slot 86 formed in the first guide rail 76. The pins 43 are proportioned and spaced so as to project through the perforations 22 of the tape 14 so as to provide a positive drive. A positive drive of the load transporting belt 42 is ensured by the provision of the teeth 74 which are formed on the pulley 44.

Figure 4:
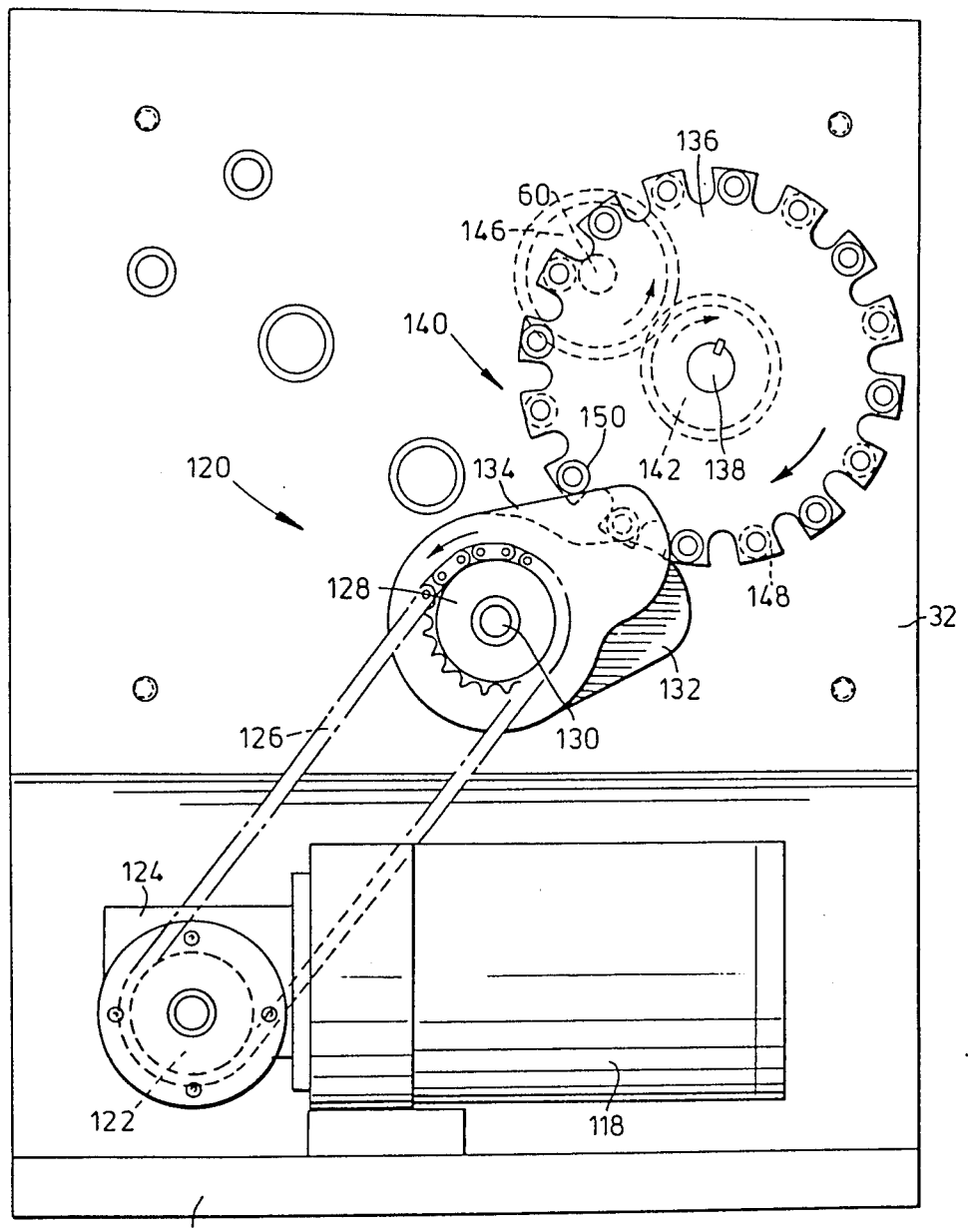
FIG. 4 is a rear view of the machine of FIG. 1.

The drive mechanism which provides an intermittent drive for the load transporting belt is generally identified by the reference numeral 120 in FIG. 4 to which reference is now made. The drive mechanism includes a motor 118 which is mounted on the base plate 28. The motor 118 drives a sprocket 122 through a reduction gear 124. A chain 126 connects the sprocket 122 to a further sprocket 128. The sprocket 128 is mounted for rotation on a shaft 130 which is supported by the back wall 32. The sprocket 128 is drivingly connected to cams 132 and 134. The cams 132 and 134 are the cam members of a Geneva gear mechanism generally identified by the reference numeral 140 which serves to impart intermittent movement to the load transporting belt 42. The mechanism 140 includes a gear wheel 136 which is keyed to the shaft 138 which is mounted for rotation in the front wall 30 and back wall 32. A gear wheel 142 is keyed to the shaft 138 and is located in the gap 144 which is formed between the front wall 30 and back wall 32. A gear wheel 146 is mounted in the gap 144 and is keyed to the shaft 60. As previously described, the shaft is the shaft on which the pulley 44 is mounted.

In operation, when the drive motor 118 is activated, it rotatably drives the sprocket 122 which in turn drives a sprocket 128. By rotatably driving the sprocket 128, the cams 132 and 134 successively engage the rollers 148 and 150 of the gear wheel 126 thereby effecting intermittent clockwise rotation of the gear 136 which is transmitted through gears 142 and 146 to the pulley 44.

An important feature of the machine of the present invention is the fact that the forward run portion 52 of the load transporting belt 42 is longitudinally elongated to an extent sufficient to permit more than one lead forming mechanism to be located along the length thereof. A further important feature is that the return length of the load transporting belt 42 is spaced a sufficient distance from the forward run to permit a portion of each lead forming mechanism to be located inwardly of the path of the load transporting belt. These features are achieved by arranging the pulleys 44, 46 and 48 so as to support the load transporting belt 42 in a generally triangular configuration. In a preferred embodiment, the axis of the sprockets 44, 46 and 48 are spaced from one another a distance of about 13 cms. to provide a forward run of about 13 cms.

Figure 3:
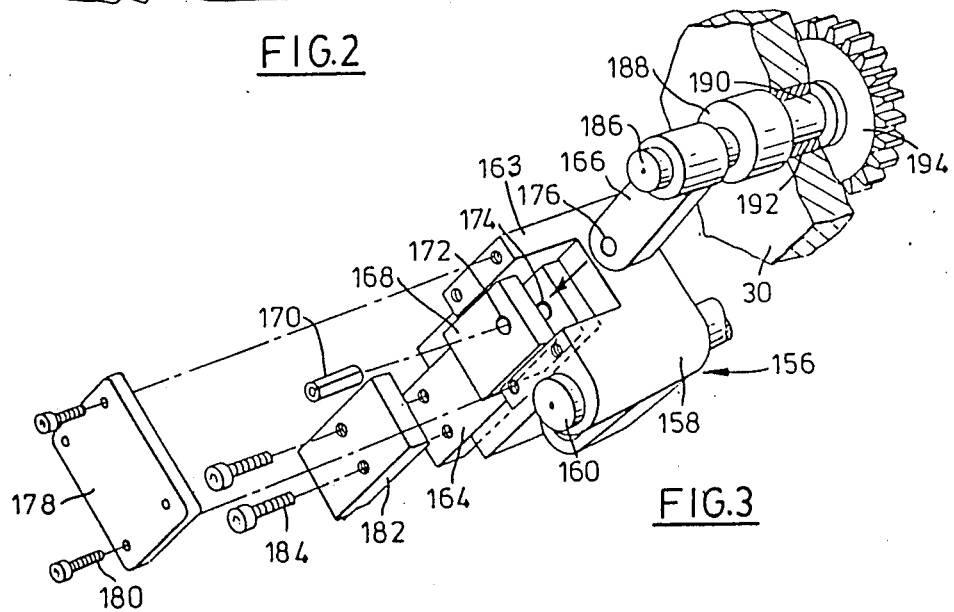
FIG. 3 is a partially exploded view of a lead forming mechanism of FIG. 1.

Within the work station 50, lead forming mechanisms 152 and 154 are serially arranged along the forward run portion 52. Each lead forming mechanism comprises first and second component forming assemblies 156 and 156a which are disposed above and below the workplane 54. The assemblies 156 are substantially identical and differ only in the configuration of the forming tool and will therefore be described with reference to FIG. 3 of the drawings. As shown in FIG. 3 of the drawings, the assembly 156 includes a housing 158 which is secured with respect to the front wall 30 by means of a dowl pin 160 and a mounting screw 162 (FIG. 1). The housing 158 is formed with a channel 163 within which a slide plate 164 is slidably mounted in a close fitting sliding relationship. The slide plate 164 is formed with a slot 168 which opens from one end thereof. The drive mechanism which drives the slide plate 164 includes an arm 166 which has one end located in the slot 168 of the slide plate 164. A pivot pin 170 is located in the passages 172, 174 and 176 of the slide 164 and arm 166 respectively. A face plate 178 is secured by means of a plurality of mounting screws 180 to the main housing 158 in a position overlying the top plate 160 enclosing a portion of the outer end of the channel 162. A removable forming tool 182 is secured by means of mounting screws 184 to the outer end of the slide member 164.

The arm 166 has a pin 186 rotatably mounted at its other end. The pin 186 is eccentrically mounted on a shaft 188. The shaft 188 has a portion of reduced diameter 190 which is mounted in a bearing 192 supported by the front wall 30. A gear wheel 194 is mounted on the shaft 190 and serves to rotatably drive the shaft 190.

Each assembly 156 and 156a has a gear wheel 194 and a shaft 190. The gear wheels 194 are distinguished in FIG. 2 of the drawings by being identified by the reference numerals 194a, 194b, 194c and 194d. Similarly, shafts 190 are distinguished by being designated 190a, 190b, 190c and 190d.

It will be noted that the shaft 190d is an extension of the shaft 130 (FIG. 4) which is driven by the sprocket 128 in response to operation of the motor 118. The gear wheel 190d is meshed with the gear wheel 190c to rotatably drive the gear wheel 190c. Similarly, the gear wheel 190d is meshed with a gear wheel 196a which is mounted for rotation on shaft 198a which is mounted in the front wall 30 and back wall 32. The gear wheel 196a is meshed with a gear wheel 196b which is mounted on a shaft 198b. The shaft 198b is mounted in the front wall 30 and back 32. The gear wheel 196b is meshed with the gear wheel 194a which is in turn meshed with the gear wheel 194b. Thus, rotation of the gear wheel 194d causes simultaneously rotation of the gear wheels 194a, 194b and 194c which effects reciprocating movement of the tool members 182 toward and away from the work path 54 as required in use.

As shown in FIG. 5 of the drawings, the work tools 182 are arranged to operate in a plane which is laterally displaced from the work path so as to be arranged to engage the leads 16 of the components 12. It will be understood that the tools 182 may be adapted to perform any required bending operation or cutting operation on the leads 16. It should also be apparent that the tools 182 may be very easily removed for servicing by releasing the mounting screws 184.

In the preferred embodiment, the lead forming mechanism 152 has removable tools 182 which are adapted to bend the leads to the required configuration and the mechanism 154 has removable tools 182 in the form of cutter blades used for severing the leads at the required length to separate the component from the tape 14.

In use, the first guide rail 76 is raised and a tape 14 bearing a plurality of components 12 is fed through the input end 56 into the guide way 80 until one of the perforations 22 in the tape 14 is aligned with one of the pins 43 of the load transporting belt 42. The first guide rail 76 is then lowered to cause the pin 43 to penetrate the perforation 24 thereby securing the tape 14 for movement with the load transporting belt 42. After the motor 118 is activated the Geneva gear 140 which is driven by the motor 118 imparts an intermittent forward movement to the load transporting belt 42 which serves to advance the tape 14 in a series of intermittent steps through the work station 50 so as to initially position each component 24 in an operable position with respect to the lead forming mechanism 152 and subsequently an inoperable position with respect to the lead forming mechanism 154 whereby the leads of successive components are initially formed to the required configuration and thereafter severed at the required length. The thus formed lead drop into the receptacle 38 and the tape is discharged into a suitable receptacle (not shown) in which it is accumulated prior to disposable.

From the foregoing it will be seen that the machine of the present invention serves to permit conventional press type forming tools to be used in the forming of the leads of electronic components.

These and other advantages of the machine of the present invention will be apparent to those skilled in the art.

I claim:

1. A machine for forming the leads of electronic components, the electronic components being intially arranged with their leads secured to and projecting laterally from an elongated tape at uniformly spaced intervals along the length thereof, said machine comprising;
    (a) a frame having an upright front wall, said upright front wall having a support face at one side thereof extending in a first plane,
    (b) an endless load transporting belt adapted to drivingly engage a lead supporting tape,
    (c) belt mounting means on said upright front wall and projecting from said first plane for supporting said load transporting belt for movement thereon, said load transporting belt having a forward run extending along a longitudinally elongated planar work path which extends through a work station in which leads of electronic components are formed to the required configuration, said belt mounting means having a free end remote from said upright front wall and over which said endless transporting belt may pass to be mounted on or removed from an operable position with pespect to said belt mounting means without the need to dismantle said frame,
    (d) a first guide rail mounted on said support face of said upright wall and disposed opposite and extending longitudinally of said forward run to define a component guideway therebetween which extends through said work station,
    (e) a second guide rail mounted on said support face of said upright wall and underlying and supporting said forward run of said load transporting belt, and
    (f) drive means engaging said load transporting belt to drive it through said work station,
    (g) at least one lead working mechanism located in said work station for use in forming the leads of said electronic components, each lead working mechanism being mounted on said support face of said upright front wall and projecting outwardly therefrom to an exposed free end, each lead working mechanism having work tool members releasably mounted at the free end thereof, said work tool members being disposed laterally outwardly from the forward run of said load transporting belt and remote from said upright front wall so as to be moveable in a work plane which is disposed laterally outwardly from the forward run of said load transporting belt so as to be operable to engage the leads of electronic components which project laterally from the load transporting belt in use.

2. A machine as claimed in claim 1 wherein said forward run is downwardly and forwardly inclined such that components which are separated from their carrier will not be supported by the forward run of the load transporting belt but will fall freely therefrom under their own weight.

3. A machine as claimed in claim 1 wherein each lead working mechanism comprises first and second complimentary forming assemblies located one on either side of said work plane, said assemblies having a work tool mounted for movement toward and away for said work plane between an open position permitting free movement of said load transporting belt through said working station and a closed position in which they operate to work the components, a drive motor, a first intermittent power transmission means communicating between the drive motor and said load transporting belt, and second intermittent power transmission means communicating between the drive motor and said first and second complimentary forming assemblies, said first and second intermittent power transmission means being syncronized such that said load transporting belt is held stationery when said first and second complimentary forming assemblies are activated to work on a component, and said first and second complimentary forming assemblies are held stationery when said load transporting belt is driven.

4. A machine for forming the leads of electronic components, the electronic components being intially arranged with their leads secured to and projecting laterally from an elongated tape at uniformly spaced intervals along the length thereof, said machine comprising;
   (a) a frame having an upright front wall, said upright front wall having a support face at one side thereof extending in a first plane,
   (b) an endless load transporting belt adapted to drivingly engage a lead supporting tape,
   (c) at least three belt mounting wheels on said upright front wall and projecting from said first plane for supporting said load transporting belt for movement thereon, said load transporting belt having a its forward run extending along a longitudinally elongated planar work path which extends through a work station in which leads of electronic components are formed to the required configuration, said belt mounting wheels being arranged to space a return run of said belt a substantial distance from said forward run to provide a large enclosure therebetween, said belt mounting wheels being mounted on shafts that project from said front wall and have a free end remote from said upright front wall and over which said endless transporting belt may pass to be mounted on or removed from an operable position with pespect to said belt mounting wheels without the need to dismantle said frame,
   (d) a first guide rail disposed opposite and extending longitudinally of said forward run to define a component guideway therebetween which extends through said work station,
   (e) a second guide rail underlying and supporting said forward run of said load transporting belt, and
   (f) drive means engaging said load transporting belt to drive it through said work station,
   (g) a lead working mechanism located in said work station for use in forming the leads of said electronic components, said lead working mechanism comprising upper and lower support members mounted on said support face and projecting outwardly therefrom, said upper support member being located above said work path and said lower support member being located work tools mounted on said upper and lower support members respectively and disposed laterally outwardly from the forward run of said load transporting belt so as to be moveable toward and away from one another in a work plane which is disposed laterally outwardly from the forward run of said load transporting belt so as to be operable to engage the leads of electronic components which project laterally from the load transporting belt in use.

5. A machine as claimed in claim 4 wherein said work plane of said work tools extends perpendicular to said work path and said forward run of said load transporting belt is downwardly and forwardly inclined such that said lower work tool is located rearwardly of the vertical plane extending through the intersection of the work plane and the work path so as to permit the lowermost component to fall freely from the elongated tape after it is formed and severed from the elongated tape.

* * * * *